(12) United States Patent
Jung et al.

(10) Patent No.: US 6,412,622 B1
(45) Date of Patent: Jul. 2, 2002

(54) APPARATUS FOR THE AUTOMATED PROCESSING OF WORKPIECES

(75) Inventors: Werner Jung, Waghäusel; Birgit Haase, Bruchsal; Daniel Metz, Kandel; Stefan Dietrich, Karlsruhe, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/743,591

(22) PCT Filed: Jul. 1, 1999

(86) PCT No.: PCT/DE99/01911
§ 371 (c)(1),
(2), (4) Date: Mar. 12, 2001

(87) PCT Pub. No.: WO00/03837
PCT Pub. Date: Jan. 27, 2000

(30) Foreign Application Priority Data

Jul. 14, 1998 (DE) .......................... 198 31 560

(51) Int. Cl.⁷ ................................ B65G 25/00
(52) U.S. Cl. ................... 198/465.2; 198/468.2
(58) Field of Search .......... 198/346.1, 465.2, 198/468.2; 414/225.01, 226.01

(56) References Cited

U.S. PATENT DOCUMENTS 4,361,413 A * 11/1982 Toda ...................... 414/225.01
4,681,210 A * 7/1987 Miki et al. ............... 198/468.2
4,691,817 A * 9/1987 Haar ........................ 198/468.2
5,321,874 A * 6/1994 Mills et al. .............. 198/346.1
6,036,431 A * 3/2000 Fujimori ................ 414/225.01

FOREIGN PATENT DOCUMENTS

| DE | 31 27 454 | 2/1983 |
| DE | 39 12 036 | 7/1990 |
| EP | 0 721 821 | 7/1996 |
| EP | 0 756 315 | 7/1996 |
| WO | WO 94/09950 | 5/1994 |

* cited by examiner

Primary Examiner—Joseph E. Valenza
(74) Attorney, Agent, or Firm—Harness, Dickey & Pierce P.L.C.

(57) ABSTRACT

Workpieces in the shape of plates can be transported from an input station to a workstation and from there to an output station by means of two manipulation device in a working plane. A gripper of one of the manipulation means can be displaced between the input station and the workstation. The gripper of the other manipulation device can be displaced between the workstation and the output station, whereby the displacement ranges overlap. As the first half of the processing time has been approximately completed in the workstation, the workpiece r is transferred from the gripper on the input side to the gripper on the output side. Meanwhile, the respectively free gripper returns to its station and to the workstation, so that the processing can be carried out almost without any interruption.

6 Claims, 2 Drawing Sheets

APPARATUS FOR THE AUTOMATED PROCESSING OF WORKPIECES

BACKGROUND OF THE INVENTION

The invention relates to a device for the automated processing of workpieces, particularly electrical printed circuit boards by means of at least one manipulation means with a movable gripper for the workpieces, whereby the device comprises at least one workstation and a further station at its two sides.

It is conventional to pick up workpieces, for example by a robot, in an input station and to transport them from there to a workstation and from there to an output station, whereby the stations are essentially situated in a plane. In order to be able to carry out the processing processes at different locations of the workpiece, it must be freely positionable in the workstation. This is achieve in that the workpiece is held and correspondingly moved by a gripper of the robot during the processing. The total cycle time is determined by the time outlay of the loading, forward transport, return transport and unloading.

SUMMARY OF THE INVENTION

The invention is based on the object of increasing the throughput of the device.

This object is achieved by an apparatus having a workstation located between an input station and an output station. The apparatus includes two independently operated manipulation means or devices which have a movable gripper for directly or indirectly holding a workpiece. The processing position of the workpiece in the workstation is controlled by the displacement of the gripper which extends essentially in one plane between one of the input and output stations and overlap in the workstation so that the workpiece is transferred from the input station to the workstation by one gripper, then gripped by both grippers and later taken from the workstation to the output station by the other gripper; and The workpiece can be fashioned as a plurality of electrical chip carriers, for example, which are combined in a multi-up to a printed circuit board, which is immediately held by a gripper. It is also possible to incorporate the individual chip carriers into a workpiece carrier, which is seized by the gripper as well as the printed circuit board. The workstation can comprise a laser unit, for example, under which laser beam the chip carriers are successively processed.

The processing content of the workpiece or, respectively, of the workpiece carrier is now distributed to the two manipulation means by the gripper changeover in the work station. As soon as the second gripper has accepted the workpiece, the first gripper can move toward a loading station, can pick up a new workplace and can return to the work station, while the preceding workpiece held in the other manipulation means is processed. After its processing has been completed, it can be moved toward an unloading station and the waiting workpiece can be led into the processing area of the workstation. Subsequent to the unloading, the second gripper can be promptly moved back again to the workstation and can accept the half-finished workpiece or, respectively, the workpiece carrier there. It is thus possible to process the workpieces in the device almost without any interruption and to correspondingly increase the throughput.

The work content of the workpiece can be evenly distributed to both handling systems, so that there is approximately the same time for the moving processes and loading or, respectively, unloading process.

The device only requires a longitudinal guide, whereby this is particularly advantageous with respect to a linear motor drive, whose magnetic track can be utilized by both manipulation means.

As a result of the transverse guide, it is possible to move the workpiece in the workstation in two coordinate directions and to correspondingly process it.

includes a transverse transport device extended between the input and output stations. The workpiece carriers can be moved in one single working plane, so that the construction of the device and the handling of the workpiece carriers is advantageous.

The working plane is also extended to the transport path, so that the grippers can act without a lifting displacement. Such a system can manage with only three workpiece carriers, for example, which are picked up in a circulatory fashion, are forwarded from the workstation to the output station, are deposited at the output station and are transported back to the loading station. The transverse displacement of the grippers is thereby not only utilized for the processing processes but also for the transverse transport, so that the transport path can linearly extend in the plane of the grippers.

DESCRIPTION OF THE PREFERRED EMBODIMENTS

Figure 1:
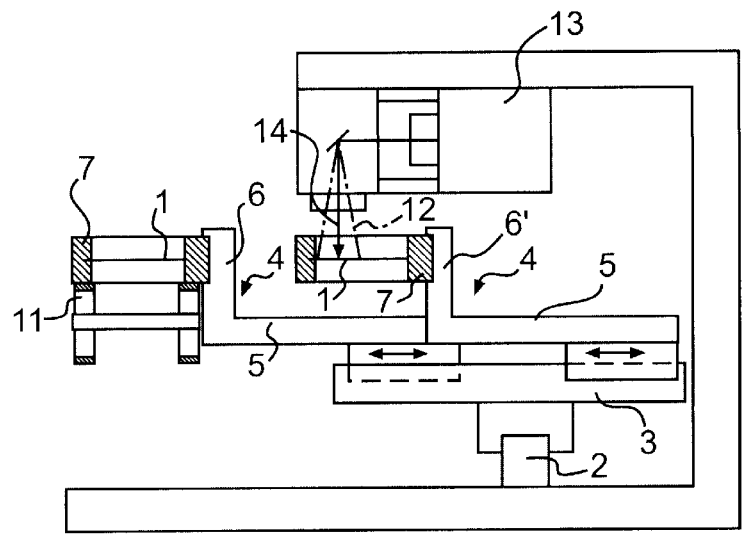
FIG. 1 shows a side view of the device for the laser processing of flat workpieces.
Figure 2:
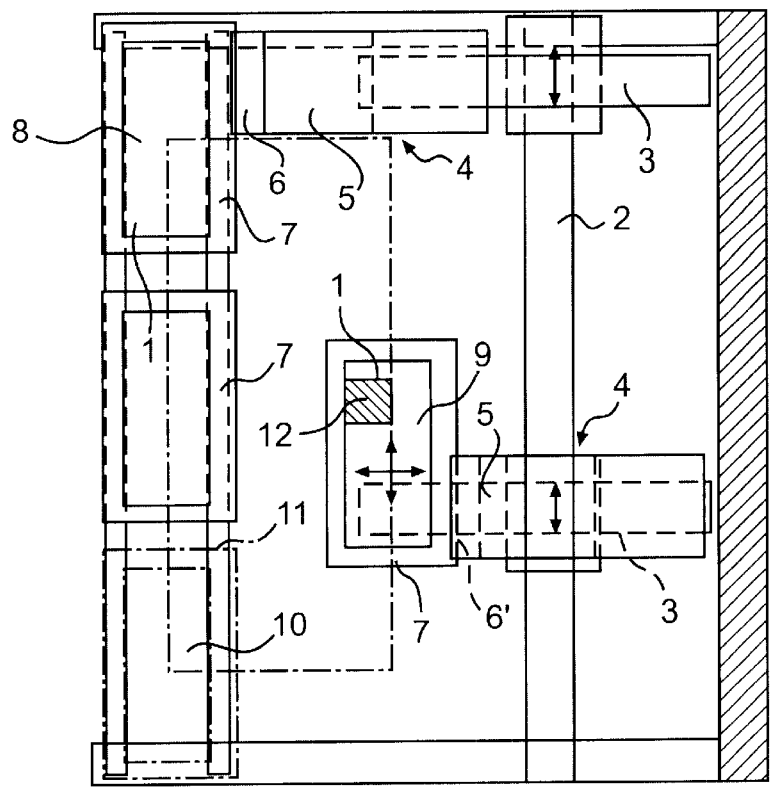
FIG. 2 shows a plan view onto the device according to FIG. 1, FIGS. 3–6 schematically show different working phases of the device according to FIG. 2.

According to FIGS. 1 and 2, a device for processing workpieces 1 fashioned as printed circuit boards is provided with a track-like longitudinal guide 2 on which two transverse guides 3 of two manipulation means 4 can be moved independently of one another by means of two linear motors. A retainer 5 can be respectively moved on the transverse guides 3, whereby the end of said retainer 5 is fashioned as a gripper 6 for a workpiece carrier 7, which picks up the workpiece 1.

The device comprises an input station 8, a workstation 9 and an output station 10. The input station 8 is situated in the area of an end of the longitudinal guide 2; the workstation 9 is situated in its center area and the output station 10 in the other end region of the longitudinal guide 2. Furthermore, a linear transport device, 11 which connects the output station 10 to the input station 8 in the height of the workpiece carriers 7, extends parallel thereto, whereby this transport plane and the displacement planes of the workpiece carriers 7, in the manipulation means, form a common working plane. An input-side manipulation means can be displaced between the input station and the workstation. Another manipulation means on the output side can be displaced between the workstation and the output station.

The workpiece carriers 7 are loaded in the input station 8 with the workpiece 1 and are seized with the gripper 6 of the first manipulation means 4. The other gripper 6' of the other manipulation means 4 holds another workpiece carrier 7 at the moment and moves it in two coordinate directions under a deflection area 12 of a laser unit 13, which directs a deflectable laser beam 14 onto the surface of the workpiece 1. It is thereby possible to structure a printed circuit board in the deflection area 12 of the laser beam 14 in a fine manner without high mechanical outlay being necessary.

FIGS. 3 to 6 show the handling of the workpiece carriers 7 by the two manipulation means in different phases.

Figure 3:
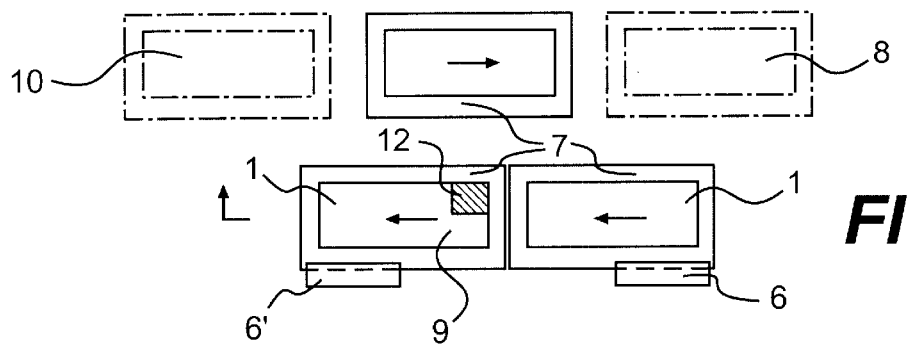

According to FIG. 3, one of the workpiece carriers 7 is held by the gripper 6 of the manipulation means on the input side and is situated in a waiting position immediately in front of the workstation 9. The gripper 6' of the manipulation means on the output side holds one of the other workpiece carriers 7, which is situated under the deflection area 12 of the laser beam of the workstation 9. A third of the workpiece carriers 7 is situated on the transport path between the output station 10 and the input station 8.

Figure 4:
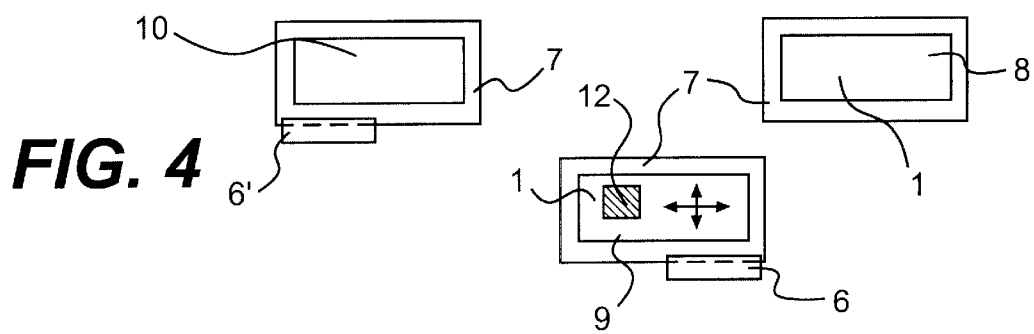

According to FIG. 4, the workpiece carrier 7 having the finished workpiece 1 has been displaced by means of the gripper 6' on the output side toward the output station 10, where it can be unloaded. The waiting workpiece carrier 7 has been moved into the deflection area 12 immediately after that, so that the processing can be continued with a short interruption. The third workpiece carrier 7 has already reached the input station 8 and has been loaded with a new workpiece 1.

Figure 5:
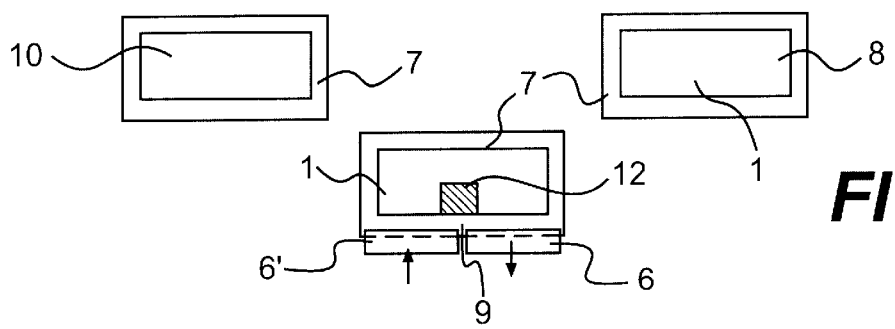

According to FIG. 5, the workpiece 1 held by the gripper on the input side is already half-finished in the workstation 9. The gripper 6' on the output side has been moved back to the workstation from the output station 10 by leaving the workpiece carrier 7 behind, and now grabs the workpiece carrier 7 situated there at the same time as the gripper 6 on the input side. This transfer occurs during a displacement step, in which the workpiece carrier 7 having the workpiece 1 moves from one processing area to another. It is thereby achieved that disturbances as a result of the transfer can have no influence or exactness. Subsequently, the gripper 6 on the input side can release the workpiece carrier 7 and can move back toward the input station 8 while the workpiece, which is now only held by the gripper 6' on the output side, can be finished.

Figure 6:
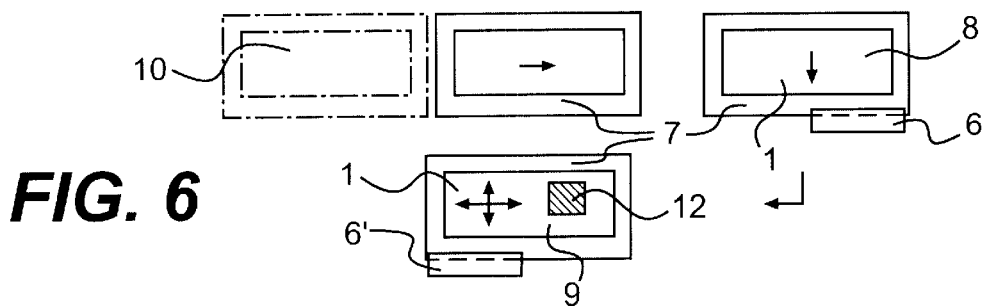

According to FIG. 6, the workpiece carrier 7 situated in the input station 8 has already been grabbed by the gripper 6 on the input side and can now move back to the waiting position in front of the workstation 9 (shown in FIG. 3), while the unloaded workpiece carrier moves on the transport path to the input station 8.

What is claimed is:

1. An apparatus for the automated processing of workpieces, said apparatus comprising two manipulation means which are operated independently of one another, each manipulation means having a movable gripper for holding a workpiece, said apparatus having a workstation disposed between an input station and an output station, said gripper being displaceable for processing positioning of the workpiece at the workstation, each of the grippers having a displacement range overlapping at the workstation with the displacement range of one gripper extending from the workstation to the input station and the range of the other gripper extending from the workstation to the output station, said grippers temporarily gripping a workpiece at the workstation and moving the piece in displacement steps at the workstation so that a workpiece can be transferred from the one gripper to the other gripper at the workstation.

2. An apparatus according to claim 1, wherein the gripper changeover occurs in the middle time period for processing a workpiece.

3. An apparatus according to claim 1, wherein the apparatus includes a common longitudinal guide for the two grippers.

4. An apparatus according to claim 3, wherein each of the grippers is mounted on the longitudinal guide by a separate transverse guide.

5. An apparatus according to claim 1, which includes a transfer device being arranged between the output station and the input station, and wherein the workpieces are inserted in carriers, said carriers moving in a circulatory path with the carrier at the input station being grasped by the one gripper and transferring to the other gripper at the workstation and the carrier held by the other gripper being transferred from the workstation to the output station where the transfer device transfers the carrier deposited at the output station back to the input station.

6. An apparatus according to claim 5, wherein the transverse device forms a linear transfer path which is situated in a working plane of the workpiece carriers held by the grippers, said transfer path extending outside of the adjustment area of the workpiece carriers at the workstation and the maximum displacement path in the transfer direction being greater than the middle distance between the workstation and the transfer path.

* * * * *